United States Patent [19]

Plesinger

[11] Patent Number: 5,132,875
[45] Date of Patent: Jul. 21, 1992

[54] REMOVABLE PROTECTIVE HEAT SINK FOR ELECTRONIC COMPONENTS

[75] Inventor: Boris M. Plesinger, Scottsdale, Ariz.

[73] Assignee: Compaq Computer Corporation, Houston, Tex.

[21] Appl. No.: 605,263

[22] Filed: Oct. 29, 1990

[51] Int. Cl.$^5$ .............................................. H05K 7/20
[52] U.S. Cl. ................................. 361/386; 174/16.3; 174/52.4; 361/383; 361/400
[58] Field of Search ............... 357/81; 174/52.4, 16.3, 174/252, 260; 165/80.3, 185; 361/382, 383, 386, 387, 388, 400, 403, 417, 419

[56] References Cited

U.S. PATENT DOCUMENTS

| | | | |
|---|---|---|---|
| 3,248,471 | 4/1966 | Danchok et al. | 174/16.3 |
| 4,594,643 | 6/1986 | Hermann | 361/386 |
| 4,621,304 | 11/1986 | Oogaki | 361/386 |
| 4,665,467 | 5/1987 | Speraw | 361/388 |
| 4,712,159 | 12/1987 | Clemens | 361/386 |
| 4,716,494 | 12/1987 | Bright | 361/386 |
| 4,748,538 | 5/1988 | Tsuji | 361/386 |
| 4,849,856 | 7/1989 | Funari | 361/386 |
| 5,014,777 | 5/1991 | Sano | 165/185 |
| 5,019,940 | 5/1991 | Clemens | 361/386 |

Primary Examiner—Gerald P. Tolin
Attorney, Agent, or Firm—Konneker & Bush

[57] ABSTRACT

A protective heat sink for an electronic component dissipates heat generated thereby. A first heat conductive member is mounted to the top side of the electronic component. A protective cap having an aperture formed therein is mounted on the printed circuit board such that it extends over the electronic component and the first heat conductive member. A second heat conductive member is mounted to the first heat conductive member and extends through the aperture in the cap such that heat generated by the electronic component is transmitted to the first heat conductive member and then dissipated to the environment by the second heat conductive member.

21 Claims, 1 Drawing Sheet

REMOVABLE PROTECTIVE HEAT SINK FOR ELECTRONIC COMPONENTS

BACKGROUND OF THE INVENTION

1. Field of the Invention

The invention relates to a heat sink for an electronic component mounted on a printed circuit board and, more particularly, to a heat sink which provides an easily removable, protective cover for a printed circuit board mounted electronic component.

2. Description of Related Art

Numerous types of electronic devices generate large amounts of heat during the operation thereof. If, however, the electronic devices were continuously operated in the presence of the high temperatures typically produced by the generated heat, the likelihood that the devices would be damaged due to continued operation in a high temperature environment increases dramatically. Accordingly, to protect electronic devices from damage due to continued operation in high temperature environments, many of such devices utilize a heat sink to dissipate heat. For example, U.S. Pat. No. 3,248,471 to Danchuk et al. discloses a heat sink for dissipating heat generated by a transistor. The heat sink comprises a case constructed of a metal material attached to a disk shaped body, also constructed of a metal material. Electrical conductors which function as the emitter, base and collector elements of the transistor, protrude therefrom and extend through the disk shaped body. In such a manner, heat generated by the transistor is dissipated through the electrical conductors to the disk shaped body.

Sufficient heat dissipation is of particular concern for highly sensitive electronic components such as fine pitch devices. In the past, heat dissipation for fine pitch electronic devices was accomplished by encapsulation techniques in which a block of a heat conductive material such as a polymer was placed over the fine pitch electronic device, thereby covering the entire device. While effective for its intended purpose, i.e. to dissipate heat generated by the fine pitch electronic device, there are several significant drawbacks to using encapsulation techniques to protect such devices from excessive heat accumulation. The most serious drawback is that, when protected by encapsulation methods, fine pitch devices are not readily repairable. To solvate the printed circuit board upon which a fine pitch device was mounted or to replace the fine pitch device itself required the removal of the silicon based encapsulation. As a result, repair techniques are quite expensive.

It is an object of this invention to provide a heat sink for a fine pitch electronic device.

It is another object of this invention to provide a readily removable heat sink for a fine pitch electronic device, thereby maintaining accessibility to the electronic device.

It is still another object of this invention to provide a readily removable heat sink for a fine pitch electronic device which also provides a protective cover for the device.

SUMMARY OF THE INVENTION

In one embodiment, the present invention is of a protective heat sink for dissipating heat generated by an electronic component mounted to a printed circuit board. The heat sink is comprised of a generally non-heat conductive cap mounted on the printed circuit board such that it extends over the electronic component. A heat conductive member for dissipating heat generated by the electronic component is mounted to the top side of the electronic component and extends through an aperture formed in the cap.

In another embodiment, the present invention is of a protective heat sink for dissipating heat generated by an electronic component mounted to a printed circuit board. A first heat conductive member is mounted to the top side of the electronic component such that heat generated by the electronic component is transmitted to the first heat conductive member. A protective cap having an aperture formed therein is mounted on the printed circuit board such that the protective cap extends over the electronic component and the first heat conductive member and the aperture is positioned over the electronic component. Preferably, the protective cap is formed of a non-heat conductive material. A second heat conductive member is mounted to the first heat conductive member and extends through the aperture in the cap such that heat generated by the electronic component is dissipated to the environment by the second heat conductive member.

In yet another embodiment, the present invention is of a method of manufacturing a removable protective heat sink for an electronic component mounted on a substrate. A protective cover having an apertured top side and at least one downwardly extending sidewall is formed from a non-heat conductive material. A first heat dissipator having a plunger section with a diameter generally equal to the diameter of the cover aperture and a base section with a diameter greater than the diameter of the cover aperture is then formed from a heat conductive material. The plunger section is inserted through the aperture and the protective cover mounted to the substrate such that the cover aperture is positioned over the electronic component.

BRIEF DESCRIPTION OF THE DRAWINGS

The invention may be better understood and its numerous objects, features and advantages will become more apparent to those skilled in the art by reference to the following drawings in which.

DETAILED DESCRIPTION OF THE INVENTION

Figure 1:
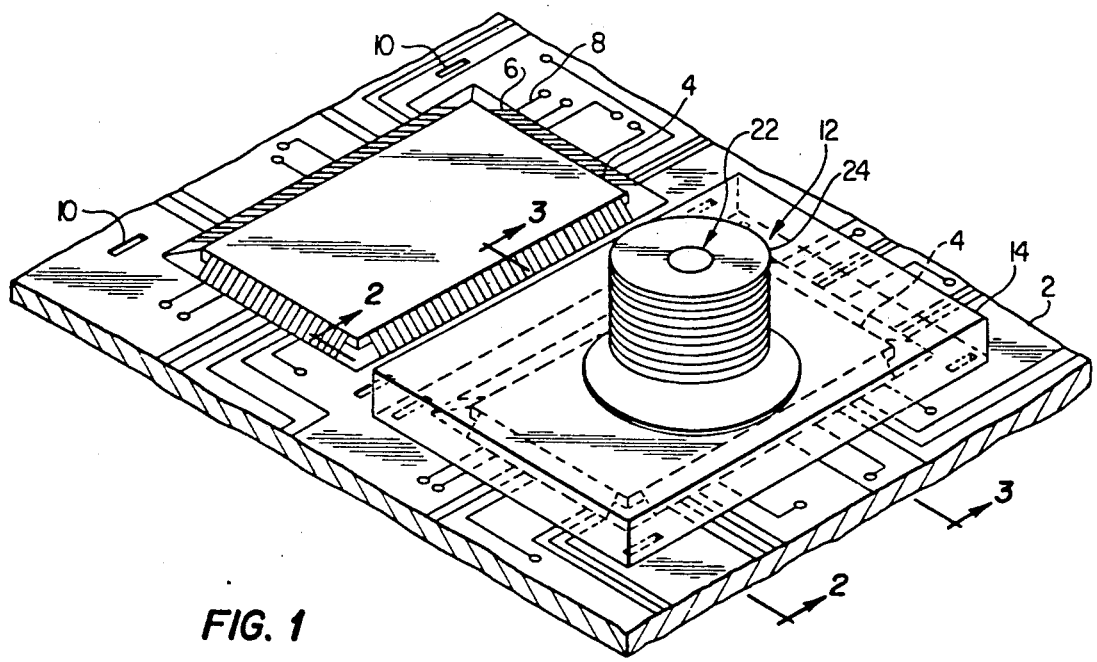
FIG. 1 is a perspective view of a removable protective heat sink constructed in accordance with the teachings of the present invention.

Referring first to FIG. 1, a removable protective heat sink 12 for dissipating heat generated by a fine pitch electronic device 4 such as a microprocessor chip and constructed in accordance with the teachings of the present invention may now be seen. In FIG. 1, a printed circuit board 2 of conventional design has a plurality of fine pitch electronic devices such as microprocessor chips 4 mounted thereon. For example, the fine pitch microprocessor chip may be constructed in accordance with the so-called "chip on tape" technology in which logic circuitry is imprinted on a mylar type using imprinting techniques well known to those skilled in the art, the excess mylar tape excised, and the fine pitch electronic device then mounted to a substrate such as the printed circuit board 2.

The fine pitch electronic device 4 is further provided with a plurality of connectors 6, which may be constructed of copper, gold or other suitable conductive material, to electrically connect the electronic device 4 with printed circuit board connectors 8. The printed circuit board 2 includes a series of slotted apertures 10 formed therein surrounding each fine pitch electronic device 4. In the embodiment disclosed herein, the printed circuit board 2 has four slotted apertures 10 formed therein surrounding each fine pitch electronic device 4. It is contemplated, however, that various numbers of slotted apertures 10 may be formed in the printed circuit board 2 and still prove suitable for use. For example, it is fully contemplated that two slotted apertures 10 may be provided surrounding each fine pitch electronic device 4 and still prove acceptable for the uses contemplated herein.

Continuing to refer to FIG. 1, the removable protective heat sink 12 may also be seen mounted over the fine pitch electronic device 4 to provide both means for dissipating heat generated by the fine pitch electronic device 4 as well as a protective cover means for the fine pitch electronic device 4. The removable protective heat sink 12 includes a protective cover 14 which is positioned over the fine pitch electronic device 4 and mounted onto the printed circuit board 2. Preferably, the cover 14 is formed of a non-heat conductive material such as a plastic material. The removable protective heat sink 12 further includes a first heat dissipator 22 and, in the preferred embodiment of the invention, a second heat dissipator 24, both of which extend upwardly from the protective cover 14.

Figure 2:
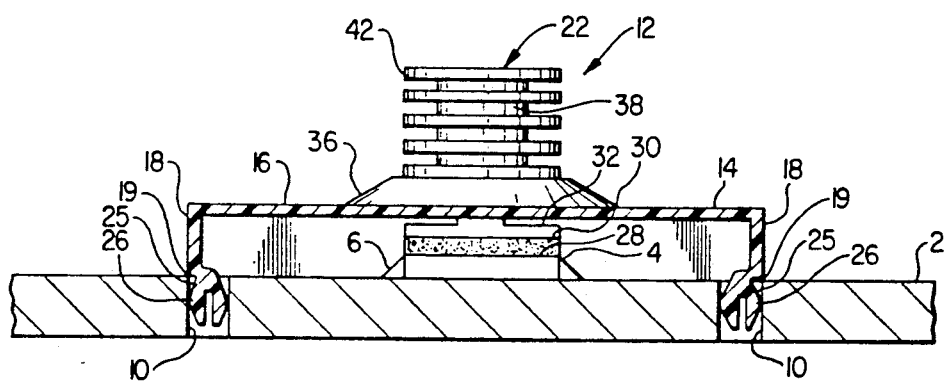
FIG. 2 is a cross-sectional view of the removable protective heat sink illustrated in FIG. 1 taken along lines 2—2 of FIG. 1.

Referring next to FIG. 2, a cross-sectional view of the removable protective heat sink 12 illustrated in FIG. 1 taken along lines 2—2 of FIG. 1 may now be seen. As may be seen in FIG. 2, the protective cover 14 is comprised of a top section 16 and first, second and third and fourth sidewalls 18 integrally formed with the top section 16 to form a bottomless cover or cap for the fine pitch electronic device 4. In the preferred embodiment of the invention, the top cover 16 should be sized to have a surface area greater than the surface area of the fine pitch electronic device 4. Also provided along the top side 16 of the protective cover 14 is a generally circular aperture 20 (not visible in FIG. 2) which, in the preferred embodiment of the invention, is formed in the center of the top section 16. Even more preferably, the generally circular aperture 20 should be formed such that the aperture is positioned over the fine pitch electronic device when the protective cover 14 is mounted to the printed circuit board 2.

Integrally formed with at least two, and, in one embodiment, four, of the sidewalls 18 of the protective cover 14 are bottom ridges 19 to which downwardly extending prongs 25 for mounting the protective cover 14 to the printed circuit board 2 are formed therewith. Typically, each prong 25 consists of two compressible arms 26 which preferably extend outwardly to an extent slightly wider than the slot 10 into which the compressible arms 26 are to be inserted. When the protective cover 14 is pressed onto the printed circuit board 2, the compressible arms 26 of the downwardly extending prongs 25 are compressingly inserted into the slots 10 until the bottom ridges 19 engage the printed circuit board 2. In such a manner, the protective cover 14 is mounted securely onto the printed circuit board 2. To later remove the protective cover 14, the sides 18 are compressed and the prongs 25 pulled out of the slots 10. By removing the protective cover 14 in this fashion, the fine pitch electronic device will be readily accessible for repair or other purposes after the removable protective heat sink has been attached thereto.

Figure 3:
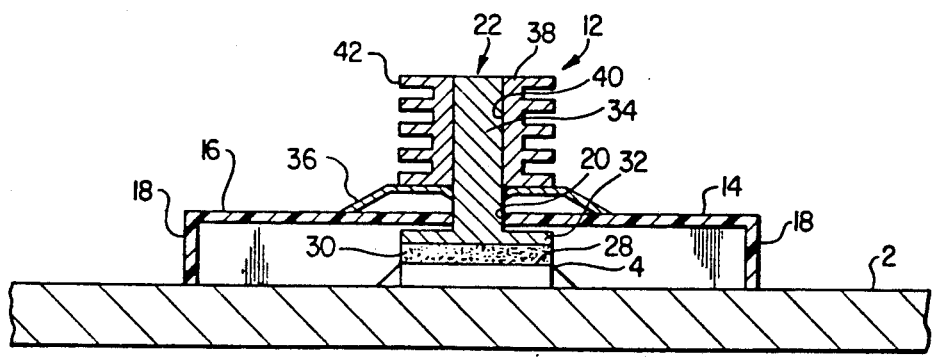
FIG. 3 is a cross-sectional view of the removable protective heat sink illustrated in FIG. 1 taken along lines 3—3 of FIG. 1.

Referring next to FIG. 3, the removable protective heat sink 12 shall now be described in greater detail. As previously described, the fine pitch electronic device 4 having connectors 6 is mounted to the printed circuit board 2 by conventional means. The top surface of the fine pitch electronic device 4 is then covered with a layer of conductive paste 30, for example, silicon grease. Preferably, the conductive paste 30 is spread out to cover the entire top side 28 of the electronic device 4. The first heat dissipator 22 is then placed on top of the conductive paste 30 to conductively mount the first heat dissipator 22 to the fine pitch electronic device 4. Preferably, the first heat dissipator 22 consists of a widened base section 32 integrally formed with a plunger section 34. Preferably, the widened base section should be formed in a generally cylindrical shape having a relatively short length and a diameter approximately equal to or slightly greater than the length of the fine pitch electronic device 4. The plunger section 34, on the other hand, while also formed in a generally cylindrical shape, has a relatively long length and a diameter less than the length of the fine pitch electronic device 4 and generally equivalent to the diameter of the aperture 20.

To mount the first heat dissipator 22 onto the conductive paste 30, the plunger section 34 is inserted through the aperture 20 of a, as yet unmounted, protective cover 14 until the base section 32 contacts the top section 16. Keeping the base section 32 biased against the top section 16, the protective cover 14 is then pressed onto the printed circuit board 2 for mounting the removable protective heat sink 12 thereon. Downward pressure is then exerted on the plunger section 34 such that the base section 32 contacts the conductive paste 30. In such a manner, the base section 32 of the first heat dissipator 22 is mounted onto the conductive paste 30 which covers the top side 28 of the fine pitch electronic device 4, thereby conductively mounting the base section 32 to the fine pitch electronic device 4.

A spring 36 is then mounted on the top section 16 of the cover 14 to bias the first heat dissipator 22 towards the fine pitch electronic device 4. In alternate embodiments of the invention, the spring 36 may be a flat spring or a Tinnerman spring which is mounted to the plunger section 34 of the first heat dissipator 22 by a press or snap fit. The second heat dissipator 24 may then be mounted to the first heat dissipator 22. More specifically, the second heat dissipator 24 includes a base member 38 having a central aperture 40 for slideably mounting the second heat dissipator 24 onto the portion of the plunger section 34 which extends above the protective cover 14 and the spring 36. In the preferred embodiment of the invention, the second heat dissipator 24 includes a plurality of circumferentially extending cooling fins 42 integrally formed with the base member 38 and provided with circumferential air apertures spaced between the circumferentially extending cooling fins 42.

Thus, there has been described and illustrated herein a heat sink for a fine pitch electronic device mounted to a printed circuit board and which further provides a non-heat conductive protective cover for the electronic device. The heat sink is readily demountable from the printed circuit board, thereby providing easy access to the electronic device. The heat sink is conductively mounted to the electronic device, extends through an aperture in the protective cover, and extends radially outward therefrom to increase the surface area thereof, thereby increasing the capacity of the heat sink to dissipate heat. However, those skilled in the art will recognize that many modifications and variations besides those specifically mentioned may be made in the techniques described herein without departing substantially from the concept of the present invention. Accordingly, it should be clearly understood that the form of the invention as described herein is exemplary only and is not intended as a limitation on the scope of the invention.

What is claimed is:

1. A heat sink and an electronic component having a top side and a base, said electronic component base being mounted to a printed circuit board, comprising:
   a non-heat conductive cap mounted on said printed circuit board and over said electronic component, said cap having an aperture formed therein, said cap providing a protective cover for said electronic component; and
   a heat-conductive member for dissipating heat generated by said electronic component, said heat conductive member mounted to said top side of said electronic component and extending through said aperture, said heat conductive member having a first, wider, section mounted on said electronic component and a second, narrower, section which extends through said aperture, said first section of said heat conductive member being wider than said aperture.

2. A heat sink according to claim 1 wherein said cap further comprises a top wall and at least one sidewall mounted to said printed circuit board, said aperture located in said top wall.

3. A heat sink according to claim 1 wherein said heat conductive member further comprises heat conductive fins mounted to the part of said second section extending outside said cap.

4. A heat sink according to claim 3 wherein said heat conductive fins radially extend beyond said aperture.

5. A heat sink and an electronic component having a top side and a base, said electronic component base being mounted to a printed circuit board, comprising:
   a non-heat conductive cap mounted on said printed circuit board and over electronic component to provide a protective cover for said electronic component, said cap having a top wall having an aperture formed therein and at least one sidewall mounted to said printed circuit board, said printed circuit board having at least one slot formed therein in proximity to said electronic component and wherein said sidewalls of said cap further comprise a corresponding number of integrally formed projections, each said at least one slot receiving one of said corresponding number of projections to removably mount said cap on said printed circuit board.

6. A heat sink and an electronic component having a top side and a base, said electronic component base being mounted to a printed circuit board, comprising:
   a non-heat conductive cap mounted on said printed circuit board and over said electronic component to provide a protective cover for said electronic component, said cap having a top wall having an aperture formed therein and at least one sidewall mounted to said printed circuit board, said printed circuit board having at least one slot formed therein in proximity to said electronic component and wherein said sidewalls of said cap further comprise a corresponding number of integrally formed projections, each said at least one slot receiving said corresponding projection to removably mount said cap on said printed circuit board, and wherein each said projection further comprises first and second arms, said first and second arms compressing when each said projection is inserted in a corresponding slot.

7. A heat sink according to claim 6 wherein said corresponding number of integrally formed projections is comprised of first and second projections provided at opposite corners.

8. A heat sink according to claim 4 and further comprising means conductively mounting said heat conductive member on said electronic component.

9. A heat sink according to claim 8 wherein said means conductively mounting said heat conductive member is comprised of a layer of a heat conductive, shock dampening material.

10. A heat sink according to claim 4 and further comprising spring means biasing said heat conductive member against said electronic component.

11. A heat sink and an electronic component having a top side and a base, said electronic component being mounted to a printed circuit board, comprising,:
   a first heat conductive member mounted to said top side of said electronic component such that heat generated by said electronic component is transmitted to said first heat conductive member, said first heat conductive member having a first, wider section mounted on said electronic component and a second narrower section extending upwardly from said first section;
   a cap positioned over said electronic component and said first heat conductive member, said cap having an aperture formed therein, said cap mounted on said printed circuit board such that said aperture is positioned over said electronic component and that part of said second, narrower section of said first heat conductive member extends through said aperture, said cap providing a protective cover for said electronic components; and
   a second heat conductive member mounted to said part of said first heat conductive member extending through said aperture, said second heat conductive member dissipating heat generated by said electronic component and transmitted to said second heat conductive by said first heat conductive member.

12. A heat sink according to claim 13 wherein the surface area of said bottom side of said first heat conductive member is greater than the area of said aperture.

13. A heat sink according to claim 12 wherein said electronic component and said first heat conductive member are generally rectangular in shape and wherein the length of said bottom side of said first heat conductive member is approximately equal to or greater than the length of said electronic component.

14. A heat sink according to claim 13 wherein the width of said bottom side of said first heat conductive member is approximately equal to or greater than the length of said electronic component.

15. A heat sink according to claim 14 wherein said second heat conductive member is generally cylindrical in shape and wherein the diameters of said aperture and said second heat conductive member are approximately equal to each other.

16. A heat sink according to claim 11 wherein said bottom side of said first heat conductive member is covered with an adhesive to mount said first heat conductive member to said electronic component.

17. A heat sink according to claim 16 wherein said adhesive is silicon grease.

18. A heat sink and an electronic component having a top side and a base, said electronic component base being mounted to a printed circuit board comprising:

a first heat conductive member mounted to said top side of said electronic component such that heat generated by said electronic component is transmitted to said first heat conductive member, said first heat conductive member having a first, wider, section mounted on said electronic component and a second, narrower section extending upwardly from said first section;

a cap positioned over said electronic component and said first heat conductive member, said cap having an aperture formed in a top side thereof, said cap mounted on said printed circuit board such that said aperture is positioned over said electronic component and that part of said second section of said first heat conductive member extends therethrough, said cap proving a protective cover for said electronic component;

a generally conical spring having a central aperture formed therein and mounted to said top side of said cap, said part of said first heat conductive member extending through said aperture to being received in said central aperture of said spring, said spring biasing said first heat conductive member against said electronic component; and a second heat conductive member mounted above said conical spring and to said part of said first heat conductive member extending through said aperture, said second heat conductive member dissipating heat generated by said electronic component and transmitted to said second heat conductive member by said first heat conductive member.

19. A heat sink according to claim 18 wherein said generally conical spring further comprises an inwardly bent section which terminates at said aperture, said inwardly bent section of said spring limiting the upward movement of said second heat conductive member.

20. A heat sink according to claim 19 and wherein said conical spring is formed of a heat conductive material.

21. A heat sink according to claim 19 and wherein said conical spring is formed of a non-heat conductive material.

* * * * *

UNITED STATES PATENT AND TRADEMARK OFFICE
CERTIFICATE OF CORRECTION

PATENT NO. : 5,132,875

DATED : July 21, 1992

INVENTOR(S) : Plesinger, Boris M.

It is certified that error appears in the above-identified patent and that said Letters Patent is hereby corrected as shown below:

Column 1, line 47, "solvate" should read --salvage--.

Claim 5, Column 5, line 59, "each said" should read --each of said--.

Signed and Sealed this

Eleventh Day of January, 1994

Attest:

BRUCE LEHMAN

Attesting Officer  Commissioner of Patents and Trademarks